United States Patent
Takakura

[11] Patent Number: 4,459,494
[45] Date of Patent: Jul. 10, 1984

[54] IGFET SCHMITT CIRCUIT

[75] Inventor: Hiromitsu Takakura, Gunma, Japan

[73] Assignees: Sanyo Electric Co., Ltd.; Tokyo Sanyo Electric Co., Ltd., both of Japan

[21] Appl. No.: 377,566

[22] Filed: May 12, 1982

[30] Foreign Application Priority Data

May 29, 1981 [JP] Japan .................... 56-83624

[51] Int. Cl.$^3$ .................. H03K 3/356; H03K 19/094; H03K 19/20
[52] U.S. Cl. .................. 307/290; 307/279; 307/448
[58] Field of Search ............. 307/279, 290, 448, 450

[56] References Cited

U.S. PATENT DOCUMENTS

| 3,882,331 | 5/1975 | Sasaki | 307/290 X |
| 3,975,649 | 8/1976 | Kawagoe et al. | 307/448 X |
| 4,023,122 | 5/1977 | Oura | 307/279 X |
| 4,097,772 | 6/1978 | Carter | 307/279 |
| 4,376,251 | 3/1983 | Kobayashi et al. | 307/290 X |
| 4,379,974 | 4/1983 | Plachno | 307/269 |
| 4,392,066 | 7/1983 | Hirao | 307/290 |

Primary Examiner—Larry N. Anagnos
Assistant Examiner—David R. Hudspeth
Attorney, Agent, or Firm—Darby & Darby

[57] ABSTRACT

A Schmitt circuit comprises a series connection of a first, second and third MOS transistors connected between a voltage source and the ground, and a fourth MOS transistor connected between the voltage source and the junction of the second and third MOS transistors. An input voltage is applied to the gates of the second and third MOS transistors. The voltage at the junction of the first and second MOS transistors is applied to the gate of the fourth MOS transistor and is also led out as an output. The Schmitt circuit further comprises a series connection of a sixth and seventh MOS transistors connected between the voltage source and the ground for dividing the source voltage, and a fifth MOS transistor connected between the junction of the sixth and seventh MOS transistors and the junction of the first and second MOS transistors and adapted to be rendered conductive when the potential at the said junction exceeds a predetermined voltage.

2 Claims, 3 Drawing Figures

IGFET SCHMITT CIRCUIT

BACKGROUND OF THE INVENTION

1. Field of the Invention

The present invention relates to a Schmitt circuit implemented using insulated gate field effect transistors. More specifically, the present invention relates to such a Schmidt circuit capable of maintaining a threshold voltage with accuracy.

2. Description of the Prior Art

Conventionally, a Schmitt circuit structured as shown in FIG. 1 implemented using insulated gate field effect transistors, hereinafter referred to as MOS transistors, has been utilized in an integrated circuit such as a large scale integration.

The FIG. 1 Schmitt circuit comprises a series connection of a first, second and third MOS transistors 1', 2' and 3' connected between a voltage source VDD and the ground, and a fourth MOS transistor 4' connected between the voltage source VDD and the junction of the second and third MOS transistors 2' and 3'. The drain and the gate of the first MOS transistor 1' is connected to the voltage source VDD, so that the first MOS transistor 1' may function as a load, while the source of the first MOS transistor 1' is connected to the drain of the second MOS transistor 2' and the gate of the fourth MOS transistor and is at the same time led out as an output VOUT. An input voltage VIN is applied to the gates of the second and third MOS transistors 2' and 3'. These first, second, third and fourth MOS transistors 1', 2', 3' and 4' may be of an N-channel type and formed in the same pellet.

Now the operation of the FIG. 1 Schmitt circuit will be described with reference to FIG. 2. Referring to FIG. 2, the input voltage VIN is indicated in the abscissa and various voltages are indicated in the ordinate. Vt1, Vt2, Vt3 and Vt4 denote threshold voltages of the first, second, third and fourth MOS transistors 1', 2', 3' and 4' and a change of a back gate bias voltage of each transistor is neglected in the description for simplicity. V1 denotes the voltage at the junction of the first and second MOS transistors 1' and 2' and V2 denotes the voltage at the junction of the second and third MOS transistors 2' and 3'.

First consider a case where the input voltage VIN is zero volt. When the voltage V1 is lower than VDD−Vt1, the first MOS transistor 1' is turned on and the voltage V1 is raised to VDD−Vt1. When the voltage V2 is lower than V1−Vt4, i.e. VDD−Vt1−Vt4 in such a situation, the fourth MOS transistor 4' is turned on and the voltage V2 is raised up to VDD−Vt1−Vt4. Thus, in the case where the input voltage VIN is zero volt, the relations of $V1 = VDD - Vt1$ and $V2 = VDD - Vt1 - Vt4$ have been established. Now consider a case where the input voltage VIN becomes higher than the threshold voltage Vt3 of the third MOS transistor 3'. Then the third MOS transistor 3' is turned on so that a current starts flowing through the fourth MOS transistor 4'. If and when the fourth MOS transistor 4' and the third MOS transistor 3' have been fabricated in the same size, then the voltage V2 starts falling at the angle of 45° with respect to the abscissa. When the difference between the input voltage VIN and the voltage V2 comes to coincide with the threshold voltage Vt2 of the second MOS transistor 2', i.e. when the auxiliary line (a) representing the voltage obtained by subtracting Vt2 from the input voltage VIN intersects the line representing the voltage V2, the second MOS transistor 2' is turned on. When the second MOS transistor is turned on, the voltage V1 decreases and the impedance of the fourth MOS transistor 4' increases, whereby the voltage V2 decreases, with the result that the voltage between the gate and source of the second MOS transistor 2' is further increased. Due to the above described feed-back function, both the voltages V1 and V2 abruptly fall to the vicinity of the ground level. At the same time the fourth MOS transistor 4' is turned off.

On the other hand, in the case where the input voltage VIN falls from a sufficiently high voltage, when the difference between the input voltage VIN and the voltage V2 becomes lower than the threshold voltage Vt2 of the second MOS transistor, i.e. when the locus representing the voltage V2 intersects the auxiliary line (a), the second MOS transistor 2' is turned off and the voltage V1 returns to the initial voltage VDD−Vt1 and at the same time the fourth MOS transistor 4' is turned on again, whereby the voltage V2 returns to the locus having the angle of the 45° with respect to the abscissa. When the input voltage VIN further becomes lower than the threshold voltage Vt3 of the third MOS transistor 3', the third MOS transistor 3' is turned off and the voltage V2 returns to the initial voltage VDD−Vt1−Vt4.

If and when the input voltage VIN is maintained zero volt for a long period of time in the above described circuit, the voltage V1 is placed in a floating state. Therefore, if and when the voltage V1 is changed toward the source voltage VDD due to an ordinary noise, a leakage current or the like, the voltage V1 is maintained in such increased voltage. Accordingly, the voltages V1 and V2 increase as shown by the dotted line in FIG. 2, with the result that the threshold voltage VTH is changed.

Now the threshold voltage VTH on the respective occasions will be evaluated based on FIG. 2. Since the first, second, third and fourth MOS transistors have been formed in the same chip, the threshold voltages Vt1, Vt2, Vt3 and Vt4 are equal to each other. Therefore, the threshold voltage VTH may be expressed by the following equation.

$$VTH = \frac{VDD - Vt1 - Vt4}{2} + Vt3$$
$$= \frac{VDD}{2}$$

On the other hand, assuming that the voltage V1 becomes higher by Vα due to a noise, then the threshold voltage VTH may be expressed as follows.

$$VTH = \frac{VDD - Vt1 - Vt4 + V\alpha}{2} + Vt3$$
$$= \frac{VDD}{2} + \frac{V\alpha}{2}$$

Accordingly, it follows that the threshold voltage VTH is shifted by (Vα/2) due to an influence caused by a noise or the like.

SUMMARY OF THE INVENTION

Briefly described, the present invention is directed to an improvement on a Schmidt circuit comprising a first and second potentials, a series connection of a first, second and third insulated gate field effect transistors connected between the first and second potentials, and a fourth insulated gate field effect transistor connected between the first potential and the junction of the second and third insulated gate field effect transistors, wherein an input voltage is applied to the gates of the second and third insulated gate field effect transistors, the voltage at the junction of the first and second insulated gate field effect transistors is applied to the gate of the fourth insulated gate field effect transistor and is also led out as an output. The inventive improvement comprises potential dividing means for dividing the potential difference between the first and second potentials, and a fifth insulated gate field effect transistor connected between the divided potential difference point and the junction of the first and second insulated gate field effect transistors and adapted to be rendered conductive when the potential at the said junction exceeds a predetermined potential. In a preferred embodiment of the present invention, the potential dividing means is implemented by a series connection of a sixth and seventh indulated gate field effect transistors connected between the first and second potentials.

According to the present invention, a Schmitt circuit is provided in which an operation thereof is performed with accuracy in accordance with a predetermined characteristic and the threshold voltage is accurately set to a predetermined voltage without being influenced by a noise, a leak current and the like.

Accordingly, a principal object of the present invention is to provide a Schmitt circuit implemented using insulated gate field effect transistors which fully eliminates an influence caused by a noise, a leak current or the like.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 3:
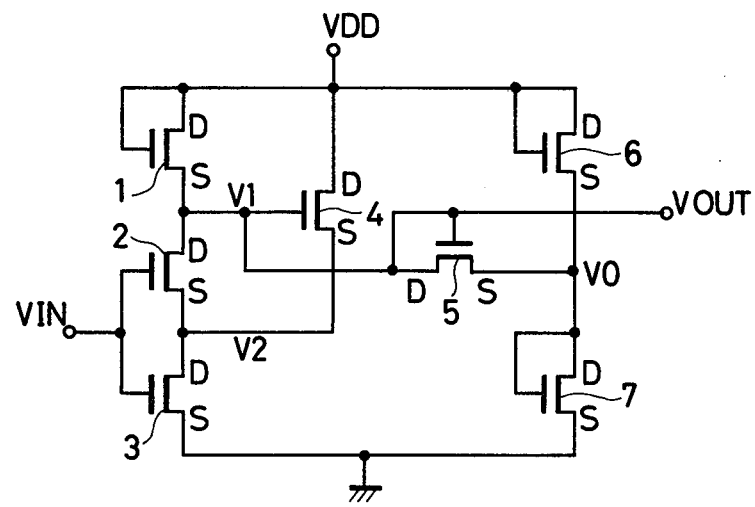
FIG. 3 is a schematic diagram of one embodiment in accordance with the present invention.

FIG. 3 is a schematic diagram showing one embodiment in accordance with the present invention. The FIG. 3 embodiment comprises a series connection of a first, second and third MOS transistors 1, 2 and 3 connected between a first potential of a voltage source VDD and a second potential of the ground, a fourth MOS transistor 4 connected between the voltage source VDD and the junction of the second and third MOS transistors 2 and 3, a potential dividing means for dividing the voltage of the voltage source VDD including a sixth and seventh MOS transistors 6 and 7, and a fifth MOS transistor connected between the junction of the first and second MOS transistors 1 and 2 and the junction of the sixth and seventh MOS transistors 6 and 7 and adapted to be turned on when the voltage V1 exceeds a predetermined voltage. All these MOS transistors may be of an enhancement N-channel type.

Figure 1:
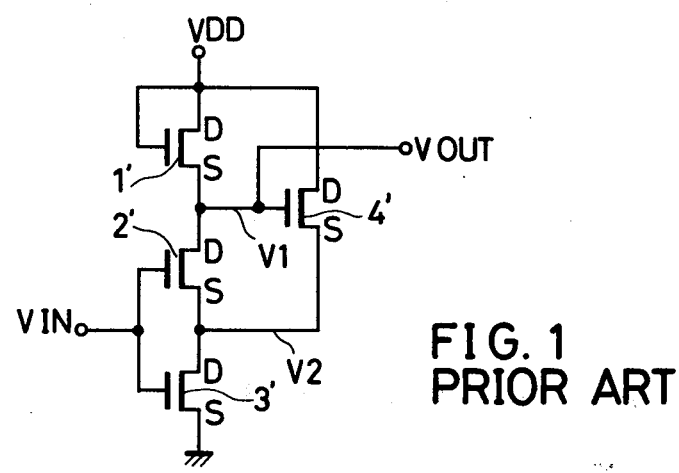
FIG. 1 is a schematic diagram of a conventional Schmidt circuit which constitutes the background of the invention.

The first, second, third and fourth MOS transistors 1, 2, 3 and 4 form the same structured as that of the FIG. 1 Schmidt circuit. The sixth and seventh MOS transistors 6 and 7 are connected in series between the voltage source VDD and the ground and the respective gates are connected to the respective drains thereof. More specifically, the sixth and seventh MOS transistors 6 and 7 each serve as an impedance device, in which each impedance is determined depending on the channel width and the channel length of each, whereby the voltage VDD is divided. The source of the fifth MOS transistor 5 is connected to the junction of the sixth and seventh MOS transistors 6 and 7 and the drain of the fifth MOS transistor is connected to the junction of the source of the first MOS transistor 1, the drain of the second MOS transistor 2 and the gate of the fourth MOS transistor 4. The gate of the fifth MOS transistor is connected to the drain thereof.

When the input voltage VIN is zero volt, the voltage V1 becomes $VDD-Vt1$. The voltage V0 at the junction of the sixth and seventh MOS transistors 6 and 7 is selected such that if and when the voltage V1 exceeds $VDD-Vt1$ due to a noise, a leak current or the like, the fifth MOS transistor 5 is turned on. More specifically, the voltage V0 is selected to be lower than the voltage V1 by the threshold voltage Vt5 of the fifth MOS transistor 5. Assuming that the ratio of the transistor sizes (W/L: W is channel width and L is channel length) of the sixth and seventh MOS transistors 6 and 7 is 1:n, then the voltage V0 may be expressed by the following equation.

$$V0 = \frac{1}{\sqrt{n}+1}(VDD - Vt6 + \sqrt{n} \cdot Vt7)$$

Therefore, in order to attain $V0=VDD-Vt1-Vt5$, the following equation must be met.

$$VDD - Vt1 - Vt5 = \frac{1}{\sqrt{n}+1}(VDD - Vt6 + \sqrt{n} \cdot Vt7)$$

$$\therefore n = \left(\frac{Vt1 + Vt5 - Vt6}{VDD - Vt1 - Vt5 - Vt7}\right)^2$$

Since all the first to seventh MOS transistors 1 to 7 are formed on the same chip, it is assumed that the respective threshold voltages are equal to each other. Accordingly, n becomes as follows.

$$n = \left(\frac{Vt}{VDD - 3Vt}\right)^2$$

Therefore, n is selected to satisfy the above described equation.

By thus designing the circuit, the voltage between the gate and the source of the fifth MOS transistor 5 exceeds the threshold voltage Vt5 in the case where the voltage V1 exceeds $VDD-Vt1$ due to a noise, a leak current or the like, whereby the fifth MOS transistor 5 is turned on and the increased voltage V1 is about to be forced down to the voltage $V0+Vt5$. On the other hand, when the voltage V1 is lowered to be lower than $VDD-Vt1$, the fifth MOS transistor 5 is turned off. As a result, the voltage V1 is fixed to $VDD-Vt1$.

Figure 2:
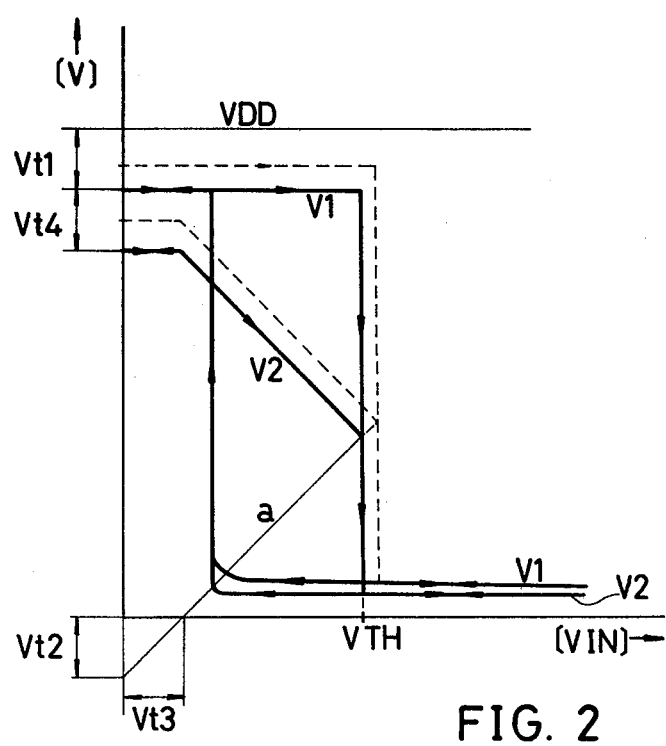
FIG. 2 is a graph depicting the operation of the FIG. 1 diagram.

Accordingly, the FIG. 3 Schmitt circuit performs with accuracy the operation as shown by the solid line in the FIG. 2 characteristic diagram, in which the threshold voltage Vth is accurately set to a half of the voltage source VDD and a shift of the level due to a noise or a leak current is fully eliminated.

In the FIG. 3 embodiment, the voltage dividing means was implemented by a series connection of two MOS transistors 6 and 7; however, the voltage dividing means may comprise a series connection of more than three MOS transistors.

Meanwhile, although the embodiment was described as embodied using the MOS transistors of an N-channel type, it goes without saying that the present invention can be performed using MOS transistors of a P-channel type. Furthermore, although the embodiment was described as comprising the potential dividing means embodied using the sixth and seventh MOS transistors 6 and 7 of an enhancement type, the present invention is not limited thereto and may be implemented using resistors, MOS transistors of a depletion type or a combination of them.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A Schmitt circuit, comprising:
   first and second power supply terminals,
   a series connection of a first, second and third insulated gate field effect transistors connected between said first and second power supply terminals, the drain of said second transistor being connected to the source of said first transistor, the source of said second transistor being connected to the drain of said third transistor,
   a fourth insulated gate field effect transistor having a drain connected to said first power supply terminal and source connected to the junction of said second and third insulated gate field effect transistors, the gate of said first transistor being connected to its respective drain,
   an input signal voltage being applied to the gates of said second and third insulated gate field effect transistors,
   the voltage at the junction of said first and second insulated gate field effect transistors being applied to the gate of said fourth insulated gate field effect transistor and being led out as an output signal voltage,
   potential dividing means for dividing the potential difference between said first and second potentials and providing said divided potential difference at a divided potential difference point, and
   a fifth insulated gate field effect transistor connected between said divided potential difference point and the junction of said first and second insulated gate field effect transistors and characterized by being rendered conductive when the potential at said junction exceeds a predetermined potential.

2. A Schmitt circuit in accordance with claim 1, wherein
   said potential dividing means comprises a series connection of a sixth and seventh insulated gate field effect transistors connected between said first and second power supply terminals.

* * * * *